(12) United States Patent
Hu et al.

(10) Patent No.: US 11,438,092 B2
(45) Date of Patent: Sep. 6, 2022

(54) EXTREMELY HIGH CODING RATES FOR NEXT-GENERATION WLAN SYSTEMS

(71) Applicant: MediaTek Singapore Pte. Ltd., Singapore (SG)

(72) Inventors: Shengquan Hu, San Jose, CA (US); Jianhan Liu, San Jose, CA (US); Thomas Edward Pare, Jr., San Jose, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/121,666

(22) Filed: Dec. 14, 2020

(65) Prior Publication Data
US 2021/0194623 A1    Jun. 24, 2021

Related U.S. Application Data

(60) Provisional application No. 62/951,189, filed on Dec. 20, 2019.

(51) Int. Cl.
*H04L 1/00* (2006.01)
*H04L 27/34* (2006.01)
*H03M 13/11* (2006.01)

(52) U.S. Cl.
CPC ....... *H04L 1/0013* (2013.01); *H03M 13/1102* (2013.01); *H04L 1/0003* (2013.01); *H04L 27/3405* (2013.01)

(58) Field of Classification Search
CPC ............... H04L 1/0013; H04L 1/0003; H04L 1/0011; H03M 13/1102; H03M 13/116; H03M 13/11
See application file for complete search history.

(56) References Cited

U.S. PATENT DOCUMENTS

2018/0294919 A1* 10/2018 Cheng .................. H04L 1/0011
2019/0165888 A1*  5/2019 Yeo ....................... H04L 1/1812

* cited by examiner

*Primary Examiner* — Shelly A Chase
(74) *Attorney, Agent, or Firm* — Han IP PLLC; Andy M. Han

(57) ABSTRACT

A method of extremely high coding rates for next-generation wireless local area network (WLAN) systems involves coding an input data at a first coding rate using codes designed for coding up to a second coding rate lower than the first coding rate to provide a coded data. The method also involves wirelessly transmitting the coded data.

20 Claims, 13 Drawing Sheets

LDPC PARAMETERS ASSOCIATED WITH NEW CODING RATE $R = 7/8$

| CODING RATES ($R$) | LDPC INFORMATION BLOCK LENGTH (BITS) | LDPC CODEWORD BLOCK LENGTH (BITS) |
|---|---|---|
| 7/8 | 539 | 616 |
| 7/8 | 1078 | 1232 |
| 7/8 | 1617 | 1848 |

(A)

| RANGE OF $N_{AVBITS}$ (BITS) | NUMBER OF LDPC CODEWORDS ($N_{CW}$) | LDPC CODEWORD LENGTH $L_{LDPC}$ (BITS) |
|---|---|---|
| $N_{AVBITS} \leq 616$ | 1 | 1232, IF $N_{AVBITS} \geq N_{PLD} + 864 \times (1-R)$ 616, OTHERWISE |
| $616 < N_{AVBITS} \leq 1232$ | 1 | 1848, IF $N_{AVBITS} \geq N_{PLD} + 1392 \times (1-R)$ 1232, OTHERWISE |
| $1232 < N_{AVBITS} \leq 1848$ | 1 | 1848 |
| $1848 < N_{AVBITS} \leq 2464$ | 2 | 1848, IF $N_{AVBITS} \geq N_{PLD} + 2776 \times (1-R)$ 1232, OTHERWISE |
| $2464 < N_{AVBITS}$ | $\left\lceil \dfrac{N_{PLD}}{1848 \cdot R} \right\rceil$ | 1848 |

LDPC PARAMETERS ASSOCIATED WITH NEW CODING RATE $R = 11/12$ (A)

| CODING RATES ($R$) | LDPC INFORMATION BLOCK LENGTH (BITS) | LDPC CODEWORD BLOCK LENGTH (BITS) |
|---|---|---|
| 11/12 | 539 | 588 |
| 11/12 | 1078 | 1176 |
| 11/12 | 1617 | 1764 |

(B)

| RANGE OF $N_{AVBITS}$ (BITS) | NUMBER OF LDPC CODEWORDS ($N_{CW}$) | LDPC CODEWORD LENGTH $L_{LDPC}$ (BITS) |
|---|---|---|
| $N_{AVBITS} \leq 588$ | 1 | 1176, IF $N_{AVBITS} \geq N_{PLD} + 828 \times (1 - R)$ 588, OTHERWISE |
| $588 < N_{AVBITS} \leq 1176$ | 1 | 1764, IF $N_{AVBITS} \geq N_{PLD} + 1320 \times (1 - R)$ 1176, OTHERWISE |
| $1176 < N_{AVBITS} \leq 1764$ | 1 | 1764 |
| $1764 < N_{AVBITS} \leq 2352$ | 2 | 1764, IF $N_{AVBITS} \geq N_{PLD} + 2652 \times (1 - R)$ 1176, OTHERWISE |
| $2352 < N_{AVBITS}$ | $\left\lceil \dfrac{N_{PLD}}{1764 \cdot R} \right\rceil$ | 1764 |

FIG. 3

| Coding Rates ($R$) | Information Block Length ($K0$, in bits) | Codeword Block Length ($L$, in bits) | Parity Bits Length ($P$, in bits) | Default Shortened Bits Length ($N_{SHRT\_DEFAULT}$) | Default Punctured Bits Length ($N_{PUNC\_DEFAULT}$) | LDPC Parity Check Matrix and Associated Parameters |
|---|---|---|---|---|---|---|
| 7/8 | 539 | 616 | 77 | 1 | 31 | $Z = 27, R = 5/6, N = 648$ |
| 7/8 | 1078 | 1232 | 154 | 2 | 62 | $Z = 54, R = 5/6, N = 1296$ |
| 7/8 | 1617 | 1848 | 231 | 3 | 93 | $Z = 81, R = 5/6, N = 1944$ |
| 11/12 | 539 | 588 | 49 | 1 | 59 | $Z = 27, R = 5/6, N = 648$ |
| 11/12 | 1078 | 1176 | 98 | 2 | 118 | $Z = 54, R = 5/6, N = 1296$ |
| 11/12 | 1617 | 1764 | 147 | 3 | 177 | $Z = 81, R = 5/6, N = 1944$ |

| Coding Rates ($R$) | Information Block Length ($K0$, in bits) | Codeword Block Length ($L$, in bits) | Parity Bits Length ($P$, in bits) | Default Shortened Bits Length ($N_{SHRT\_DEFAULT}$) | Default Punctured Bits Length ($N_{PUNC\_DEFAULT}$) | LDPC Parity Check Matrix and Associated Parameters |
|---|---|---|---|---|---|---|
| 6/7 | 540 | 630 | 90 | 0 | 18 | $Z=27, R=5/6, N=648$ |
| 6/7 | 1080 | 1260 | 180 | 0 | 36 | $Z=54, R=5/6, N=1296$ |
| 6/7 | 1620 | 1890 | 270 | 0 | 54 | $Z=81, R=5/6, N=1944$ |
| 8/9 | 536 | 603 | 67 | 4 | 41 | $Z=27, R=5/6, N=648$ |
| 8/9 | 1080 | 1215 | 135 | 0 | 81 | $Z=54, R=5/6, N=1296$ |
| 8/9 | 1616 | 1818 | 202 | 4 | 122 | $Z=81, R=5/6, N=1944$ |
| 9/10 | 540 | 600 | 60 | 0 | 48 | $Z=27, R=5/6, N=648$ |
| 9/10 | 1080 | 1200 | 120 | 0 | 96 | $Z=54, R=5/6, N=1296$ |
| 9/10 | 1620 | 1800 | 180 | 0 | 144 | $Z=81, R=5/6, N=1944$ |
| 10/11 | 536 | 594 | 54 | 0 | 54 | $Z=27, R=5/6, N=648$ |
| 10/11 | 1080 | 1188 | 108 | 0 | 108 | $Z=54, R=5/6, N=1296$ |
| 10/11 | 1620 | 1782 | 162 | 0 | 162 | $Z=81, R=5/6, N=1944$ |

| EHT MCS Index | Modulation | Coding Rate |
|---|---|---|
| 12 | 4096 QAM | 3/4 |
| 13 | 4096 QAM | 5/6 |
| 14 | 4096 QAM | 7/8 |
| 15 | 4096 QAM | 11/12 |

| EHT MCS Index | Modulation | Coding Rate |
|---|---|---|
| 12 | 4096 QAM | 3/4 |
| 13 | 4096 QAM | 5/6 |
| 14 | 4096 QAM | 11/12 |

FIG. 7

| Reserved Bit | EHT MCS Bits | EHT MCS Index | Modulation | Coding Rate |
|---|---|---|---|---|
| 0 | 1100 | 12 | 4096 QAM | 3/4 |
| 0 | 1101 | 13 | 4096 QAM | 5/6 |
| 0 | 1110 | 14 | TBD | TBD |
| 0 | 1111 | 15 | TBD | TBD |
| 1 | 0000 | 16 | 4096 QAM | 7/8 |
| 1 | 0001 | 17 | 4096 QAM | 11/12 |

FIG. 8

| Capability Field | Indications |
|---|---|
| 00 | 4096 QAM NOT SUPPORTED |
| 01 | 4096 QAM SUPPORTED WITH 3/4 CODING RATE |
| 10 | 4096 QAM SUPPORTED WITH 5/6 CODING RATE |
| 11 | 4096 QAM SUPPORTED WITH 7/8 (OR 11/12) CODING RATE |

EXTREMELY HIGH CODING RATES FOR NEXT-GENERATION WLAN SYSTEMS

CROSS REFERENCE TO RELATED PATENT APPLICATION

The present disclosure is part of a non-provisional patent application claiming the priority benefit of U.S. Provisional Patent Application Nos. 62/951,189, filed 20 Dec. 2019, the content of which being incorporated by reference in its entirety.

TECHNICAL FIELD

The present disclosure is generally related to wireless communications and, more particularly, to extremely high coding rates for next-generation wireless local area network (WLAN) systems.

BACKGROUND

Unless otherwise indicated herein, approaches described in this section are not prior art to the claims listed below and are not admitted as prior art by inclusion in this section.

For extreme high-throughput (EHT) systems such as WLAN systems in accordance with the upcoming Institute of Electrical and Electronics Engineers (IEEE) 802.11be standard, 4096-quadrature amplitude modulation (4096-QAM) has been chosen as one of the technologies to achieve the target of extremely high throughput. In current WLAN systems based on one or more of the IEEE 802.11 standards, the highest coding rate is 5/6. Considering up to eight or even sixteen transmit antennas that could be available in an EHT WLAN based on the IEEE 802.11be standard, it may be reasonable to assume that higher coding rate(s) could be operated with transmit beamforming to obtain beamforming gain. Therefore, there is a need for a solution to provide higher coding rates to achieve extremely high throughput in next-generation WLAN systems.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to provide schemes, concepts, designs, techniques, methods and apparatuses pertaining to extremely high coding rates for next-generation WLAN systems. Specifically, under various proposed schemes in accordance with the present disclosure, new coding rates higher than 5/6, such as 7/8 and 11/12, may be implemented. With such new higher coding rates, overall system throughput may be improved (e.g., by about 5% and 10%, respectively, compared with existing coding rates). Moreover, to reduce complexity in implementation, encoding processes of the new coding rates in accordance with various proposed schemes of the present disclosure may be based on existing low-density parity-check (LDPC) codes as defined in IEEE 802.11n/ac/ax standards by using several new parameters introduced herein. Advantageously, LDPC encoder and decoder designs used in WLAN based on IEEE 802.11n/ac/ax standards may be reused for these new coding rates.

In one aspect, a method may involve coding an input data at a first coding rate using codes designed for coding up to a second coding rate lower than the first coding rate to provide a coded data. The method may also involve wirelessly transmitting the coded data.

It is noteworthy that, although description provided herein may be in the context of certain radio access technologies, networks and network topologies such as, Wi-Fi, the proposed concepts, schemes and any variation(s)/derivative(s) thereof may be implemented in, for and by other types of radio access technologies, networks and network topologies such as, for example and without limitation, Bluetooth, ZigBee, $5^{th}$ Generation (5G)/New Radio (NR), Long-Term Evolution (LTE), LTE-Advanced, LTE-Advanced Pro, Internet-of-Things (IoT), Industrial IoT (IIoT) and narrowband IoT (NB-IoT). Thus, the scope of the present disclosure is not limited to the examples described herein.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation to clearly illustrate the concept of the present disclosure.

FIG. 2 is a diagram of an example design in accordance with the present disclosure.

FIG. 3 is a diagram of an example design in accordance with the present disclosure.

FIG. 4 is a diagram of an example design in accordance with the present disclosure.

FIG. 6 is a diagram of an example design in accordance with the present disclosure.

FIG. 7 is a diagram of an example design in accordance with the present disclosure.

FIG. 8 is a diagram of an example design in accordance with the present disclosure.

FIG. 9 is a diagram of an example design in accordance with the present disclosure.

DETAILED DESCRIPTION OF PREFERRED EMBODIMENTS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Implementations in accordance with the present disclosure relate to various techniques, methods, schemes and/or solutions pertaining to extremely high coding rates for next-generation WLAN systems. According to the present disclosure, a number of possible solutions may be implemented separately or jointly. That is, although these possible solutions may be described below separately, two or more of these possible solutions may be implemented in one combination or another.

Figure 1:
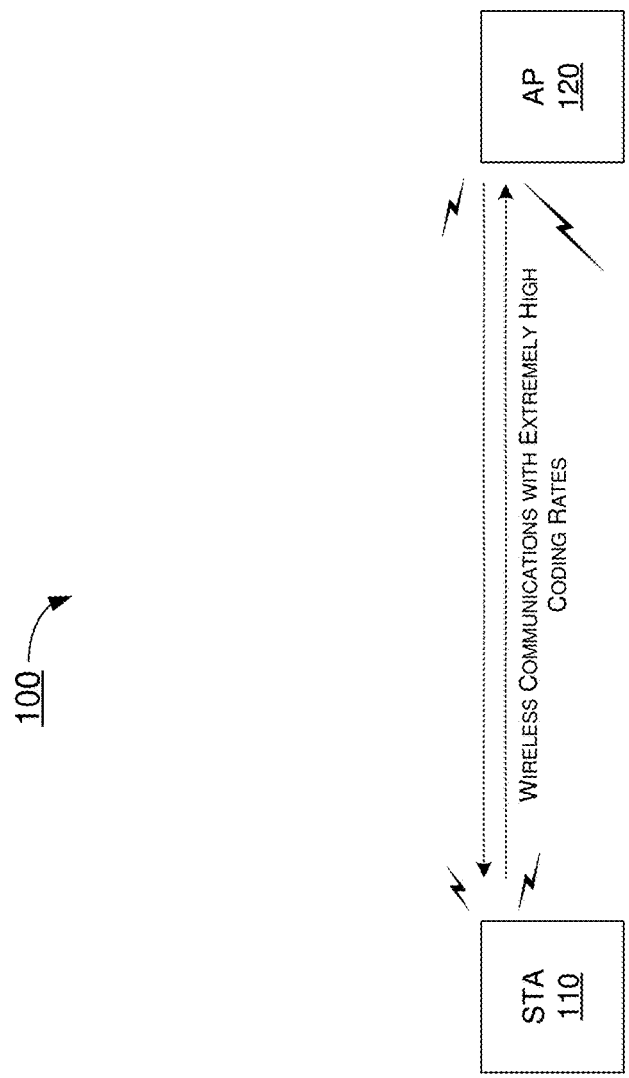
FIG. 1 is a diagram of an example network environment in which various solutions and schemes in accordance with the present disclosure may be implemented.
Figure 11:
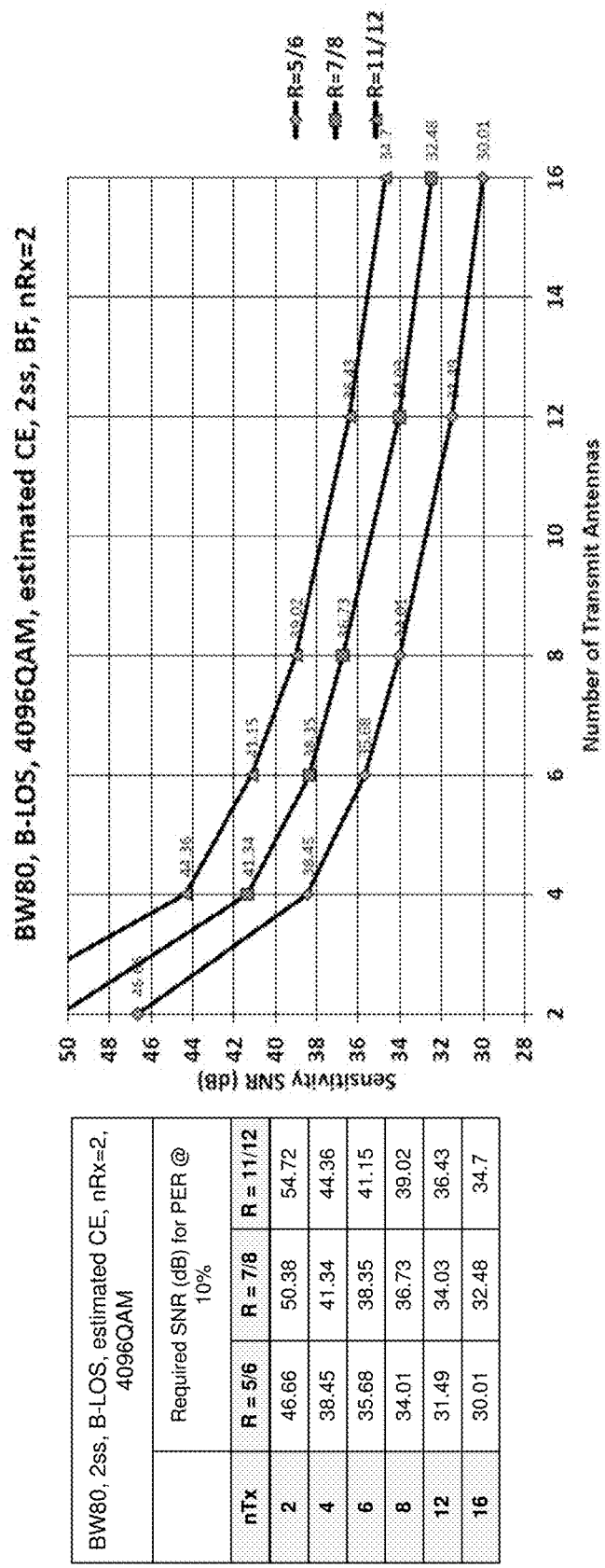
FIG. 11 is a diagram of an example scenario in accordance with the present disclosure.

FIG. 1 illustrates an example network environment 100 in which various solutions and schemes in accordance with the present disclosure may be implemented. FIG. 2 FIG. 11 illustrate examples of implementation of various proposed schemes in network environment 100 in accordance with the present disclosure. The following description of various proposed schemes is provided with reference to FIG. 1 FIG. 11.

Referring to FIG. 1, network environment 100 may involve at least a STA 110 communicating wirelessly with an access point (AP) 120. In some cases, STA 110 and AP 120 may be associated with a basic service set (BSS) in accordance with one or more IEEE 802.11 standards (e.g., IEEE 802.11be and future-developed standards). Each of STA 110 and AP 120 may be configured to communicate with each other using extremely high coding rates in accordance with various proposed schemes described below.

FIG. 2 illustrates an example design 200 in accordance with the present disclosure. Referring to FIG. 2, design 200 introduces new LDPC parameters associated with a new coding rate R of 7/8. For instance, for R=7/8, a length of LDPC information block (which is the length of a bit stream of data at the input of an LDPC encoder) may be 539 bits, 1078 bits or 1617 bits, and the correspondingly length of LDPC codeword block (which is the length of the encoded stream of data at the output of the LDPC encoder) may be 616 bits, 1232 bits or 1848 bits, respectively. Moreover, in design 200, there may be several ranges of numbers of available bits ($N_{avbits}$), each of which corresponding to respective LDPC parameters including a number of LDPC codewords ($N_{CW}$) and a length of LDPC codeword ($L_{LDPC}$).

In part (A) of FIG. 2, various example sets of input length and output length corresponding to coding rate R=7/8 are shown. In part (B) of FIG. 2, various example LDPC parameters $N_{CW}$ and $L_{LDPC}$ corresponding to coding rate R=7/8 are shown. Specifically, depending on the length of input data (e.g., in terms of the number of available bits, $N_{avbits}$) a corresponding set of $N_{CW}$ and $L_{LDPC}$ may be used in coding the data. For instance, for the range of $N_{avbits} \le 616$, $N_{CW}$ may be 1 and $L_{LDPC}$ may be either 1232 (if $N_{avbits} \ge$ the number of bits in the Physical Layer Convergence Protocol (PLCP) service data unit (PSDU) and a SERVICE field ($N_{pld}$)+864×(1−R)) or 616 (if otherwise). For the range of 616<$N_{avbits} \le 1232$, $N_{CW}$ may be 1 and $L_{LDPC}$ may be either 1848 (if $N_{avbits} \ge N_{pld}$+1392×(1−R)) or 1232 (if otherwise). For the range of 1232<$N_{avbits} \le 1848$, $N_{CW}$ may be 1 and $L_{LDPC}$ may be 1848. For the range of 1848<$N_{avbits} \le 2464$, $N_{CW}$ may be 2 and $L_{LDPC}$ may be either 1848 (if $N_{avbits} \ge N_{pld}$+2776×(1−R)) or 1232 (if otherwise). For the range of 2464<$N_{avbits}$, $N_{CW}$ may be [$N_{pld}/(1848 \times R)$] and $L_{LDPC}$ may be 1848.

FIG. 3 illustrates an example design 300 in accordance with the present disclosure. Referring to FIG. 3, design 300 introduces new LDPC parameters associated with a new coding rate R of 11/12. For instance, for R=11/12, LDPC information block length may be 539 bits, 1078 bits or 1617 bits, and the correspondingly LDPC codeword block length may be 588 bits, 1176 bits or 1764 bits, respectively. Moreover, in design 300, there may be several ranges of $N_{avbits}$, each of which corresponding to a respective $N_{CW}$ and $L_{LDPC}$.

In part (A) of FIG. 3, various example sets of input length and output length corresponding to coding rate R=11/12 are shown. In part (B) of FIG. 3, various example LDPC parameters $N_{CW}$ and $L_{LDPC}$ corresponding to coding rate R=11/12 are shown. Specifically, depending on the length of input data (e.g., in terms of the number of available bits, $N_{avbits}$) a corresponding set of $N_{CW}$ and $L_{LDPC}$ may be used in coding the data. For instance, for the range of $N_{avbits} \le 588$, $N_{CW}$ may be 1 and $L_{LDPC}$ may be either 1176 (if $N_{avbits} \ge N_{pld}$+828×(1−R)) or 588 (if otherwise). For the range of 588<$N_{avbits} \le 1176$, $N_{CW}$ may be 1 and $L_{LDPC}$ may be either 1764 (if $N_{avbits}$ $N_{pld}$+1320×(1−R)) or 1176 (if otherwise). For the range of 1176<$N_{avbits} \le 1764$, $N_{CW}$ may be 1 and $L_{LDPC}$ may be 1764. For the range of 1764<$N_{avbits} \le 2352$, $N_{CW}$ may be 2 and $L_{LDPC}$ may be either 1764 (if $N_{avbits} \ge N_{pld}$+2652×(1−R)) or 1176 (if otherwise). For the range of 2352<$N_{avbits}$, $N_{CW}$ may be [$N_{pld}/(1764 \times R)$] and $L_{LDPC}$ may be 1764.

FIG. 4 illustrates an example design 400 in accordance with the present disclosure. Referring to FIG. 4, design 400 introduces new encoding parameters associated with the higher coding rates of the present disclosure, including a number of total shortening bits ($N_{shrt}$), a default number of total shortening bits ($N_{shrt\_default}$), a number of total punctured bits ($N_{punc}$) and a default number of total punctured bits ($N_{punc\_default}$). In design 400, there may be several combinations of parameters associated with new coding rates 7/8 and 11/12. For instance, for R=7/8, the length of information block (K0) may be 539 bits, the length of codeword block (L) may be 616 bits, the length of parity bits (P) may be 77 bits, $N_{shrt\_default}$ may be 1, $N_{punc\_default}$ may be 31, and the parameters used in selecting LDPC parity check matrices may be Z=27, R=5/6 and n=648. Alternatively, for R=7/8, K0 may be 1078 bits, L may be 1232 bits, P may be 154 bits, $N_{shrt\_default}$ may be 2, $N_{punc\_default}$ may be 62, and parameters used in selecting LDPC parity check matrices may be Z=54, R=5/6 and n=1296. Still alternatively, for R=7/8, K0 may be 1617 bits, L may be 1848 bits, P may be 231 bits, $N_{shrt\_default}$ may be 3, the $N_{punc\_default}$ may be 93, and parameters used in selecting LDPC parity check matrices may be Z=81, R=5/6 and n=1944. For R=11/12, K0 may be 539 bits, L may be 588 bits, P may be 49 bits, $N_{shrt\_default}$ may be 1, the $N_{punc\_default}$ may be 59, and parameters used in selecting LDPC parity check matrices may be Z=27, R=5/6 and n=648. Alternatively, for R=11/12, K0 may be 1078 bits, L may be 1176 bits, P may be 98 bits, $N_{shrt\_default}$ may be 2, the $N_{punc\_default}$ may be 118, and parameters used in selecting LDPC parity check matrices may be Z=54, R=5/6 and n=1296. Still alternatively, for R=11/12, K0 may be 1617 bits, L may be 1764 bits, P may be 147 bits, $N_{shrt\_default}$ may be 3, the $N_{punc\_default}$ may be 177, and parameters used in selecting LDPC parity check matrices may be Z=81, R=5/6 and n=1944.

Figure 5:
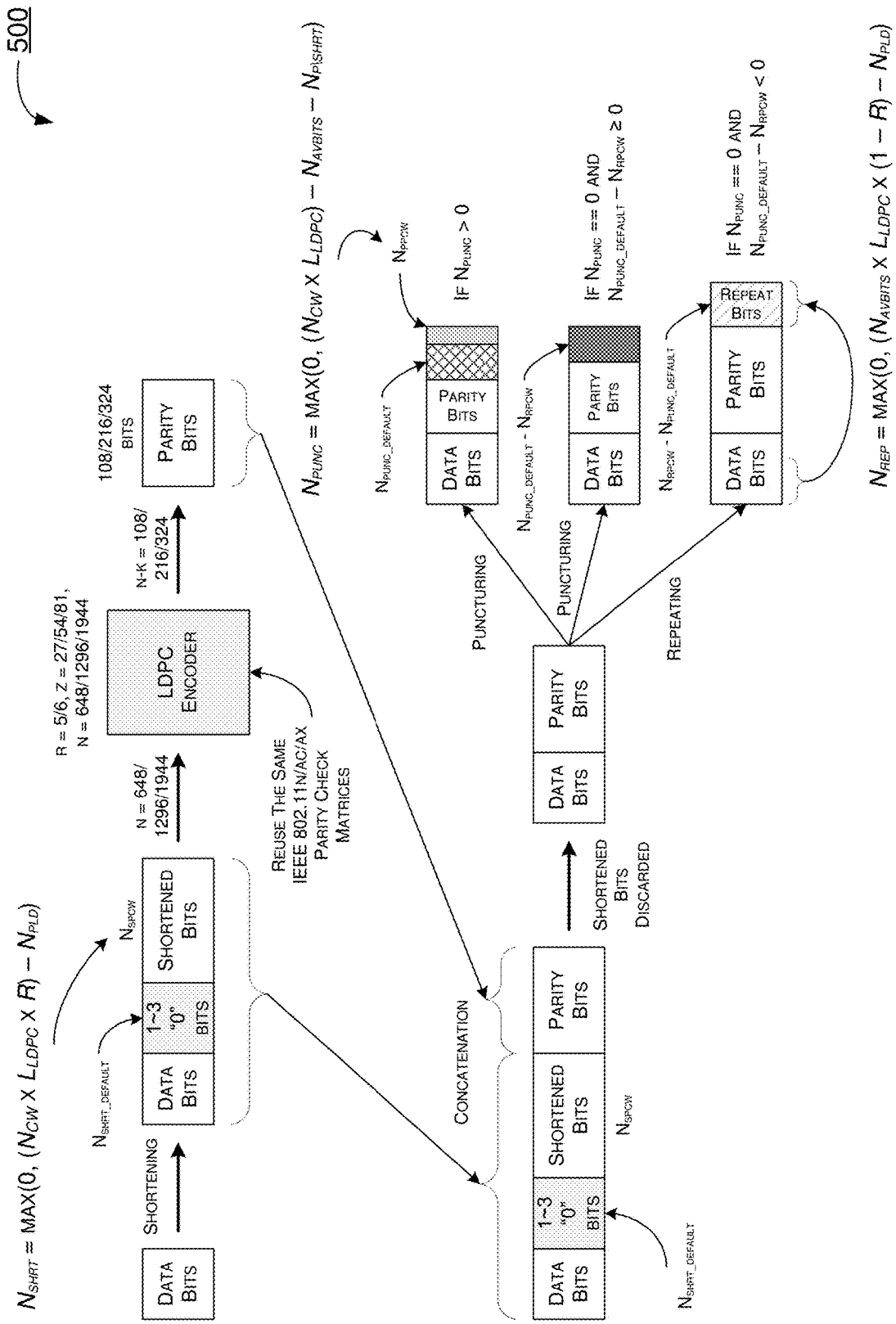
FIG. 5 is a diagram of an example scenario in accordance with the present disclosure.

FIG. 5 illustrates an example scenario 500 in accordance with a proposed scheme of the present disclosure. Scenario 500 shows an example of overall LDPC encoding process for new coding rates (e.g., R=7/8 and 11/12) under a proposed scheme of the present disclosure. It is noteworthy that, except for the use of fixed R=5/6 in the function block of LDPC parity check bits generation, new coding rates (e.g., R=7/8 and 11/12) apply in other function blocks in scenario 500.

Referring to FIG. 5, in coding data bits of an input data, a shortening procedure may be performed on the input data to provide a bit string. The bit string may include a plurality of data bits of the input data, one or more default shortened bits (e.g., zero through three "0" bits), and a plurality of shortening bits calculated from the shortening process. Additionally, a plurality of parity bits may be generated based on the bit string. Moreover, the parity bits may be appended to the bit string to provide a concatenated bit string. Furthermore, the one or more default shortened bits and the plurality of shortened bits may be discarded from the concatenated bit string to provide a shortened bit string. Then, either a puncturing procedure or a repeating procedure may be performed on the shortened bit string.

Under the proposed scheme, a number of total shortening bits ($N_{shrt}$) of the plurality of shortening bits may be calculated as follows: $N_{shrt}=\max(0, (N_{CW} \times L_{LDPC} \times R) - N_{pld})$. Moreover, a value of the number of default shortened bits ($N_{shrt\_default}$) may correspond to the first coding rate (R), a respective information block length (K0), a respective codeword block length (L), a respective length of the parity bits (P) such that: (a) for R=7/8, K0=539, L=616 and P=77, $N_{shrt\_default}=1$; (b) for R=7/8, K0=1078, L=1232 and P=154, $N_{shrt\_default}=2$; (c) for R=7/8, K0=1617, L=1848 and P=231, $N_{shrt\_default}=3$; (d) for R=11/12, K0=539, L=588 and P=49, $N_{shrt\_default}=1$; (e) for R=11/12, K0=1078, L=1176 and P=98, $N_{shrt\_default}=2$; and (f) for R=11/12, K0=1617, L=1764 and P=147, $N_{shrt\_default}=3$.

Under the proposed scheme, in performing the puncturing procedure, certain operations may be performed. For instance, a number of total punctured bits may be calculated. Moreover, responsive to the number of total punctured bits determined to be greater than zero, a first number of bits of the parity bits may be punctured. Alternatively, responsive to the number of total punctured bits determined to be equal to zero and a number of repeated bits per codeword being greater than a number of default punctured bits, a second number of bits of the parity bits may be punctured. In such cases, the first number may equal the number of default punctured bits plus a number of punctured bits per codeword. Additionally, the second number may equal the number of default punctured bits minus the number of repeated bits per codeword.

Under the proposed scheme, a value of the number of default punctured bits ($N_{punc\_default}$) may correspond to the first coding rate (R), a respective information block length (K0), a respective codeword block length (L), a respective length of the parity bits (P) such that: (a) for R=7/8, K0=539, L=616 and P=77, $N_{punc\_default}=31$; (b) for R=7/8, K0=1078, L=1232 and P=154, $N_{punc\_default}=62$; (c) for R=7/8, K0=1617, L=1848 and P=231, $N_{punc\_default}=93$; (d) for R=11/12, K0=539, L=588 and P=49, $N_{punc\_default}=59$; (e) for R=11/12, K0=1078, L=1176 and P=98, $N_{punc\_default}=118$; and (f) for R=11/12, K0=1617, L=1764 and P=147, $N_{punc\_default}=177$.

Under the proposed scheme, in performing the puncturing procedure, additional operations may be performed. For instance, the number of punctured bits per codeword ($N_{ppcw}$) may be determined based on the number of total punctured bits. In such cases, in calculating the number of total punctured bits, the number of total punctured bits ($N_{punc}$) may be calculated as follows: $N_{punc}=\max(0, (N_{CW} \times L_{LDPC}) - N_{avbits} - N_{shrt})$.

Under the proposed scheme, in performing the repeating procedure, certain operations may be performed. For instance, a number of total repeated bits may be calculated. Additionally, the total repeated bits may be appended to the parity bits responsive to a number of total punctured bits being equal to zero and a number of default punctured bits being less than a number of repeated bits per codeword.

Under the proposed scheme, in calculating the number of total repeated bits, the number of total repeated bits ($N_{rep}$) may be calculated as follows: $N_{rep}=\max(0, N_{avbits} - N_{CW} \times L_{LDPC} \times (1-R) - N_{pld})$.

Under the proposed scheme, in performing the puncturing procedure, responsive to a number of total punctured bits ($N_{punc}$) being greater than or equal to zero, continuous puncturing may be performed on the shortened bit string by discarding last $N_{punc\_default}+N_{ppcw}$ bits of the parity bits.

Under the proposed scheme, in performing the puncturing procedure, responsive to a number of total punctured bits ($N_{punc}$) being greater than zero, interleaved puncturing may be performed on the shortened bit string by first discarding $N_{punc\_default}$ bits of the parity bits in an interleaved way and then discarding last $N_{ppcw}$ bits of remaining bits of the parity bits.

Under the proposed scheme, in discarding the $N_{punc\_default}$ bits of the parity bits in the interleaved way, one bit for every three bits of the parity bits may be discarded responsive to the first coding rate being 7/8. Alternatively, one bit for every two bits of the parity bits may be discarded responsive to the first coding rate being 11/12.

FIG. 6 illustrates an example design 600 in accordance with the present disclosure. Referring to FIG. 6, design 600 introduces new encoding parameters for other high coding rates such as, for example and without limitation, 6/7, 8/9, 9/10 and 10/11. For instance, for R=6/7, K0 may be 540 bits, L may be 630 bits, P may be 90 bits, $N_{shrt\_default}$ may be 0, the $N_{punc\_default}$ may be 18, and parameters used in selecting LDPC parity check matrices may be Z=27, R=5/6 and n=648. Alternatively, for R=6/7, K0 may be 1080 bits, L may be 1260 bits, P may be 180 bits, $N_{shrt\_default}$ may be 0, the $N_{punc\_default}$ may be 36, and parameters used in selecting LDPC parity check matrices may be Z=54, R=5/6 and n=1296. Still alternatively, for R=6/7, K0 may be 1620 bits, L may be 1890 bits, P may be 270 bits, $N_{shrt\_default}$ may be 0, the $N_{punc\_default}$ may be 54, and parameters used in selecting LDPC parity check matrices may be Z=81, R=5/6 and n=1944. For R=8/9, K0 may be 536 bits, L may be 603 bits, P may be 67 bits, $N_{shrt\_default}$ may be 4, the $N_{punc\_default}$ may be 41, and parameters used in selecting LDPC parity check matrices may be Z=27, R=5/6 and n=648. Alternatively, for R=8/9, K0 may be 1080 bits, L may be 1215 bits, P may be 135 bits, $N_{shrt\_default}$ may be 0, the $N_{punc\_default}$ may be 81, and parameters used in selecting LDPC parity check matrices may be Z=54, R=5/6 and n=1296. Still alternatively, for R=8/9, K0 may be 1616 bits, L may be 1818 bits, P may be 202 bits, $N_{shrt\_default}$ may be 4, the $N_{punc\_default}$ may be 122, and parameters used in selecting LDPC parity check matrices may be Z=81, R=5/6 and n=1944. For R=9/10, K0 may be 540 bits, P may be 60 bits, $N_{shrt\_default}$ may be 0, the $N_{punc\_default}$ may be 48, and parameters used in selecting LDPC parity check matrices may be Z=27, R=5/6 and n=648. Alternatively, for R=9/10, K0 may be 1080 bits, L may be 1200 bits, P may be 120 bits, $N_{shrt\_default}$ may be 0, the $N_{punc\_default}$ may be 96, and parameters used in selecting LDPC parity check matrices may be Z=54, R=5/6 and n=1296. Still alternatively, for R=9/10, K0 may be 1620 bits, L may be 1800 bits, P may be 180 bits, $N_{shrt\_default}$ may be 0, the $N_{punc\_default}$ may be 144, and parameters used in selecting LDPC parity check matrices may be Z=81, R=5/6 and n=1944. For R=10/11, K0 may be 540 bits, L may be 594 bits, P may be 54 bits, $N_{shrt\_default}$ may be 0, the $N_{punc\_default}$ may be 54, and parameters used in selecting LDPC parity check matrices may be Z=27, R=5/6 and n=648. Alternatively, for R=10/11, K0 may be 1080 bits, L may be 1188 bits, P may be 108 bits, $N_{shrt\_default}$ may be 0, the $N_{punc\_default}$ may be 108, and parameters used in selecting LDPC parity check matrices may be Z=54, R=5/6 and n=1296. Still alternatively, for R=10/11, K0 may be 1620 bits, L may be 1782 bits, P may be 162 bits, $N_{shrt\_default}$ may be 0, the $N_{punc\_default}$ may be 162, and parameters used in selecting LDPC parity check matrices may be Z=81, R=5/6 and n=1944.

Under a proposed scheme of puncturing of parity bits in accordance with the present disclosure, either an option of continuous puncturing or another option of interleaved puncturing may be utilized. With continuous puncturing, the last $N_{punc\_default}$ plus a number of punctured bits per codeword ($N_{ppcw}$), herein denoted as $N_{punc\_default}+N_{ppcw}$, parity bits may be discarded as: $P_{n-k-N_{ppcw}-N_{punc\_default-1}}, \ldots P_{n-k-1}$. Under the proposed scheme, the option of continuous puncturing may be applied for both the case in which a number of total punctured bits $N_{punc}>0$ and the case in which $N_{punc}=0$.

With interleaved puncturing, the first $N_{punc\_default}$ parity bits may be punctured in an interleaved way as described below. For R=7/8, the $N_{punc\_default}$ bits may be discarded as: $P_{0:3:3 \cdot N_{punc\_default-1}}$. That is, in an event that R=7/8, one parity bit of every three parity bits may be discarded. For the remaining parity bits, the last $N_{ppcw}$ bits may be discarded. For R=11/12, the $N_{punc\_default}$ bits may be discarded as: $P_{0:2:2 \cdot (n-k-N_{punc\_default})} P_{2 \cdot (n-k-N_{punc\_default})+1:n-k-1}$. That is, in an event that R=11/12, one parity bit of every two parity bits may be discarded. For the remaining parity bits, the last $N_{ppcw}$ bits may be discarded. Under the proposed scheme, the option of interleaved puncturing may be applied for the case of $N_{punc}>0$.

FIG. 7 illustrates an example design 700 in accordance with the present disclosure. Referring to FIG. 7, design 700 introduces new modulation and coding scheme (MCS) indexes for the proposed new coding with 4096-QAM. For instance, the new MCSs shown in FIG. 7 may be appended to existing high-efficiency (HE)-MCSs in the IEEE 802.11ax standard for different resource units (RUs) and RU combinations. Accordingly, the signaling MCSs as defined in the IEEE 802.11 standards may be reused with new MCS indexes for signaling of the new coding rates proposed herein.

FIG. 8 illustrates an example design 800 in accordance with the present disclosure. Referring to FIG. 8, design 800 introduces new MCS indexes for the proposed new coding with 4096-QAM. For instance, the new MCSs shown in FIG. 8 may be appended to existing HE-MCSs and EHT-MCSs in the IEEE 802.11ax/be standards for different RUs and RU combinations. Accordingly, the signaling MCSs as defined in the IEEE 802.11 standards may be reused with new MCS indexes for signaling of the new coding rates proposed herein. Under a proposed scheme in accordance with the present disclosure, one reserved bit may be used together with existing MCS bits to indicate the newly defined MCSs, as shown in FIG. 8.

FIG. 9 illustrates an example design 900 in accordance with the present disclosure. Under a proposed scheme, the support of 4096-QAM in EHT WLAN may be optional. Under the proposed scheme, indication of support of 4096-QAM and different coding rates may be included in the capability field(s) and may be exchanged among STAs (including APs and non-AP STAs). For instance, two bits may be utilized as the indication of new coding rates with 4096-QAM or new MCSs, as shown in FIG. 9.

Figure 10:
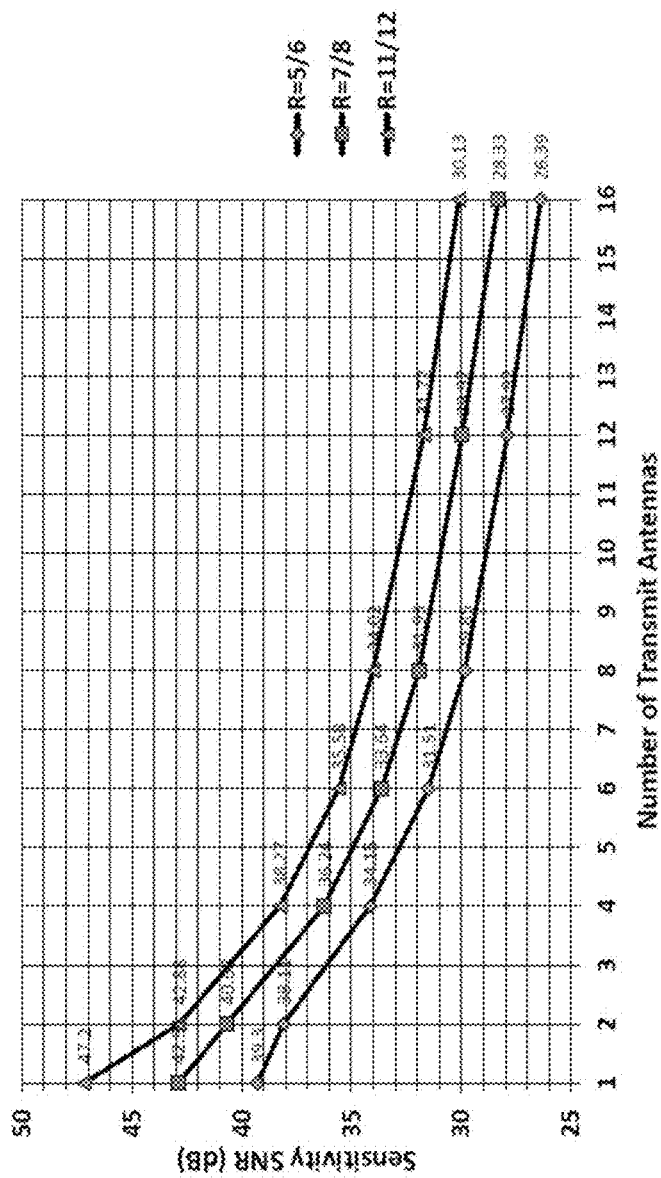
FIG. 10 is a diagram of an example scenario in accordance with the present disclosure.

FIG. 10 illustrates an example scenario 1000 in accordance with the present disclosure. For illustrative purposes and without limiting the scope of the present disclosure, scenario 1000 shows sensitivity signal-to-noise ratio (SNR) requirements for higher coding rates proposed herein (e.g., R=7/8 and 11/12). FIG. 11 illustrates an example scenario 1100 in accordance with the present disclosure. For illustrative purposes and without limiting the scope of the present disclosure, scenario 1100 shows sensitivity SNR requirements for higher coding rates proposed herein (e.g., R=7/8 and 11/12).

Illustrative Implementations

Figure 12:
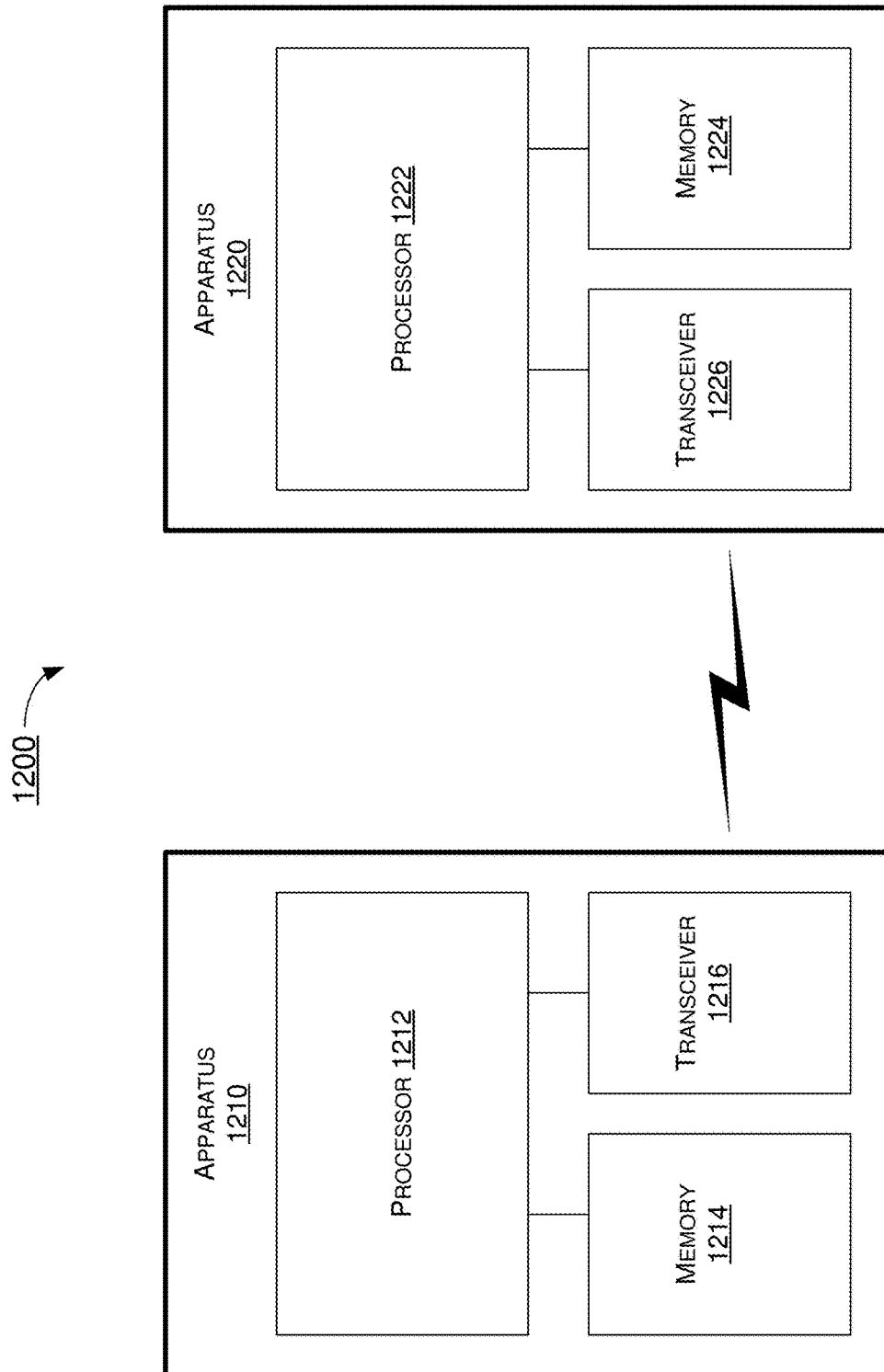
FIG. 12 is a block diagram of an example communication system in accordance with an implementation of the present disclosure.

FIG. 12 illustrates an example system 1200 having at least an example apparatus 1210 and an example apparatus 1220 in accordance with an implementation of the present disclosure. Each of apparatus 1210 and apparatus 1220 may perform various functions to implement schemes, techniques, processes and methods described herein pertaining to extremely high coding rates for next-generation WLAN systems, including the various schemes described above with respect to various proposed designs, concepts, schemes, systems and methods described above as well as processes described below. For instance, apparatus 1210 may be implemented in STA 110 and apparatus 1220 may be implemented in AP 120, or vice versa.

Each of apparatus 1210 and apparatus 1220 may be a part of an electronic apparatus, which may be a STA or an AP, such as a portable or mobile apparatus, a wearable apparatus, a wireless communication apparatus or a computing apparatus. When implemented in a STA, each of apparatus 1210 and apparatus 1220 may be implemented in a smartphone, a smart watch, a personal digital assistant, a digital camera, or a computing equipment such as a tablet computer, a laptop computer or a notebook computer. Each of apparatus 1210 and apparatus 1220 may also be a part of a machine type apparatus, which may be an IoT apparatus such as an immobile or a stationary apparatus, a home apparatus, a wire communication apparatus or a computing apparatus. For instance, each of apparatus 1210 and apparatus 1220 may be implemented in a smart thermostat, a smart fridge, a smart door lock, a wireless speaker or a home control center. When implemented in or as a network apparatus, apparatus 1210 and/or apparatus 1220 may be implemented in a network node, such as an AP in a WLAN.

In some implementations, each of apparatus 1210 and apparatus 1220 may be implemented in the form of one or more integrated-circuit (IC) chips such as, for example and without limitation, one or more single-core processors, one or more multi-core processors, one or more reduced-instruction set computing (RISC) processors, or one or more complex-instruction-set-computing (CISC) processors. In the various schemes described above, each of apparatus 1210 and apparatus 1220 may be implemented in or as a STA or an AP. Each of apparatus 1210 and apparatus 1220 may include at least some of those components shown in FIG. 12 such as a processor 1212 and a processor 1222, respectively, for example. Each of apparatus 1210 and apparatus 1220 may further include one or more other components not pertinent to the proposed scheme of the present disclosure (e.g., internal power supply, display device and/or user interface device), and, thus, such component(s) of apparatus 1210 and apparatus 1220 are neither shown in FIG. 12 nor described below in the interest of simplicity and brevity.

In one aspect, each of processor 1212 and processor 1222 may be implemented in the form of one or more single-core processors, one or more multi-core processors, one or more RISC processors or one or more CISC processors. That is, even though a singular term "a processor" is used herein to refer to processor 1212 and processor 1222, each of processor 1212 and processor 1222 may include multiple processors in some implementations and a single processor in other implementations in accordance with the present disclosure. In another aspect, each of processor 1212 and processor 1222 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, each of processor 1212 and processor 1222 is a special-purpose machine specifically designed, arranged and configured to perform specific tasks including those pertaining to extremely high coding rates for next-generation WLAN systems in accordance with various implementations of the present disclosure.

In some implementations, apparatus 1210 may also include a transceiver 1216 coupled to processor 1212. Transceiver 1216 may include a transmitter capable of wirelessly transmitting and a receiver capable of wirelessly receiving data. In some implementations, apparatus 1220 may also include a transceiver 1226 coupled to processor 1222. Transceiver 1226 may include a transmitter capable of wirelessly transmitting and a receiver capable of wirelessly receiving data. It is noteworthy that, although transceiver 1216 and transceiver 1226 are illustrated as being external to and separate from processor 1212 and processor 1222, respectively, in some implementations, transceiver 1216 may be an integral part of processor 1212 as a system on chip (SoC) and/or transceiver 1226 may be an integral part of processor 1222 as a SoC.

In some implementations, apparatus 1210 may further include a memory 1214 coupled to processor 1212 and capable of being accessed by processor 1212 and storing data therein. In some implementations, apparatus 1220 may further include a memory 1224 coupled to processor 1222 and capable of being accessed by processor 1222 and storing data therein. Each of memory 1214 and memory 1224 may include a type of random-access memory (RAM) such as dynamic RAM (DRAM), static RAM (SRAM), thyristor RAM (T-RAM) and/or zero-capacitor RAM (Z-RAM). Alternatively, or additionally, each of memory 1214 and memory 1224 may include a type of read-only memory (ROM) such as mask ROM, programmable ROM (PROM), erasable programmable ROM (EPROM) and/or electrically erasable programmable ROM (EEPROM). Alternatively, or additionally, each of memory 1214 and memory 1224 may include a type of non-volatile random-access memory (NVRAM) such as flash memory, solid-state memory, ferroelectric RAM (FeRAM), magnetoresistive RAM (MRAM) and/or phase-change memory.

Each of apparatus 1210 and apparatus 1220 may be a communication entity capable of communicating with each other using various proposed schemes in accordance with the present disclosure. For illustrative purposes and without limitation, a description of capabilities of apparatus 1210, as STA 110, and apparatus 1220, as AP 120, is provided below. It is noteworthy that, although a detailed description of capabilities, functionalities and/or technical features of apparatus 1210 is provided below, the same may be applied to apparatus 1220 although a detailed description thereof is not provided solely in the interest of brevity. It is also noteworthy that, although the example implementations described below are provided in the context of WLAN, the same may be implemented in other types of networks.

Under a proposed scheme pertaining to extremely high coding rates for next-generation WLAN systems in accordance with the present disclosure, with apparatus 1210 implemented in or as STA 110 and apparatus 1220 implemented in or as AP 120 in network environment 100, processor 1212 of apparatus 1210 may code an input data at a first coding rate using codes designed for coding up to a second coding rate lower than the first coding rate to provide a coded data. Additionally, processor 1212 may wirelessly transmit, via transceiver 1216, the coded data (e.g., to apparatus 1220 as AP 120).

In some implementations, in coding the input data at the first coding rate using codes designed for coding up to the second coding rate, processor 1212 may code the input data at a rate higher than 5/6 using LDPC codes defined in one of IEEE 802.11n/ac/ax standards using 4096-QAM. Moreover, in wirelessly transmitting the coded data, processor 1212 may wirelessly transmit the coded data with transmit beamforming.

In some implementations, the second coding rate may be 5/6, and the first coding rate may be a rate higher than 5/6. For instance, the first coding rate may be 6/7, 7/8, 8/9, 9/10, 10/11, or 11/12.

In some implementations, in coding the input data, processor 1212 may perform certain operations. For instance, processor 1212 may perform a shortening procedure on the input data to provide a bit string comprising a plurality of data bits of the input data, one or more default shortened bits, and a plurality of shortening bits calculated from the shortening process. Additionally, processor 1212 may generate a plurality of parity bits based on the bit string. Moreover, processor 1212 may append the parity bits to the bit string to provide a concatenated bit string. Furthermore, processor 1212 may discard the one or more default shortened bits and the plurality of shortened bits from the concatenated bit string to provide a shortened bit string. Then, processor 1212 may either: (a) perform a puncturing procedure on the shortened bit string; or (b) perform a repeating procedure on the shortened bit string.

In some implementations, in performing the shortening procedure, processor 1212 may calculate a number of total shortening bits ($N_{shrt}$) of the plurality of shortening bits as follows: $N_{shrt} = \max(0, (N_{CW} \times L_{LDPC} \times R) - N_{pld})$. Here, $N_{CW}$ may denote a number of LDPC codewords, $L_{LDPC}$ may denote a length of LDPC codeword, R may denote the first coding rate which is 7/8 or 11/12, and $N_{pld}$ may denote a number of bits in a PSDU and a SERVICE field.

In some implementations, a value of the number of default shortened bits ($N_{shrt\_default}$) may correspond to the first coding rate (R), a respective information block length (K0), a respective codeword block length (L), a respective length of the parity bits (P) such that: (a) for R=7/8, K0=539, L=616 and P=77, $N_{shrt\_default}$=1; (b) for R=7/8, K0=1078, L=1232 and P=154, $N_{shrt\_default}$=2; (c) for R=7/8, K0=1617, L=1848 and P=231, $N_{shrt\_default}$=3; (d) for R=11/12, K0=539, L=588 and P=49, $N_{shrt\_default}$=1; (e) for R=11/12, K0=1078, L=1176 and P=98, $N_{shrt\_default}$=2; and (f) for R=11/12, K0=1617, L=1764 and P=147, $N_{shrt\_default}$=3.

In some implementations, in performing the puncturing procedure, processor 1212 may perform certain operations. For instance, processor 1212 may calculate a number of total punctured bits. Moreover, processor 1212 may either: (a) responsive to the number of total punctured bits determined to be greater than zero, puncture a first number of bits of the parity bits; or (b) responsive to the number of total punctured bits determined to be equal to zero and a number of repeated bits per codeword being greater than a number of default punctured bits, puncture a second number of bits of the parity bits. In such cases, the first number may equal the number of default punctured bits plus a number of punctured bits per codeword. Additionally, the second number may equal the number of default punctured bits minus the number of repeated bits per codeword.

In some implementations, a value of the number of default punctured bits ($N_{punc\_default}$) may correspond to the first coding rate (R), a respective information block length (K0), a respective codeword block length (L), a respective length of the parity bits (P) such that: (a) for R=7/8, K0=539, L=616 and P=77, $N_{punc\_default}$=31; (b) for R=7/8, K0=1078, L=1232 and P=154, $N_{punc\_default}$=62; (c) for R=7/8, K0=1617, L=1848 and P=231, $N_{punc\_default}$=93; (d) for R=11/12, K0=539, L=588 and P=49, $N_{punc\_default}$=59; (e) for R=11/12, K0=1078, L=1176 and P=98, $N_{punc\_default}$=118; and (f) for R=11/12, K0=1617, L=1764 and P=147, $N_{punc\_default}$=177.

In some implementations, in performing the puncturing procedure, processor 1212 may perform additional operations. For instance, processor 1212 may determine the number of punctured bits per codeword ($N_{ppcw}$) based on the number of total punctured bits. In such cases, in calculating the number of total punctured bits, processor 1212 may calculate the number of total punctured bits ($N_{punc}$) as follows: $N_{punc}$=max (0, ($N_{CW} \times L_{LDPC}$)–$N_{avbits}$–$N_{shrt}$). Here, $N_{CW}$ may denote a number of LDPC codewords, $L_{LDPC}$ may denote a length of LDPC codeword, $N_{avbits}$ may denote a number of available bits, and $N_{shrt}$ may denote a number of total shortening bits.

In some implementations, in performing the repeating procedure, processor 1212 may perform certain operations. For instance, processor 1212 may calculate a number of total repeated bits. Additionally, processor 1212 may append the total repeated bits to the parity bits responsive to a number of total punctured bits being equal to zero and a number of default punctured bits being less than a number of repeated bits per codeword.

In some implementations, in calculating the number of total repeated bits, processor 1212 may calculate the number of total repeated bits ($N_{rep}$) as follows: $N_{rep}$=max (0, $N_{avbits}$–$N_{CW} \times L_{LDPC} \times (1-R) - N_{pld}$). Here, $N_{avbits}$ may denote a number of available bits, $N_{CW}$ may denote a number of LDPC codewords, $L_{LDPC}$ may denote a length of LDPC codeword, R may denote the first coding rate which is 7/8 or 11/12, and $N_{pld}$ may denote a number of bits in a PSDU and a SERVICE field.

In some implementations, in performing the puncturing procedure, responsive to a number of total punctured bits ($N_{punc}$) being greater than or equal to zero, processor 1212 may perform continuous puncturing on the shortened bit string by discarding last $N_{punc\_default}+N_{ppcw}$ bits of the parity bits. Here, $N_{punc\_default}$ may denote a number of default punctured bits, and $N_{ppcw}$ may denote a number of punctured bits per codeword.

In some implementations, in performing the puncturing procedure, responsive to a number of total punctured bits ($N_{punc}$) being greater than zero, processor 1212 may perform interleaved puncturing on the shortened bit string by first discarding $N_{punc\_default}$ bits of the parity bits in an interleaved way and then discarding last $N_{ppcw}$ bits of remaining bits of the parity bits. Here, $N_{punc\_default}$ may denote a number of default punctured bits, and $N_{ppcw}$ may denote a number of punctured bits per codeword.

In some implementations, in discarding the $N_{punc\_default}$ bits of the parity bits in the interleaved way, processor 1212 may discard one bit for every three bits of the parity bits responsive to the first coding rate being 7/8. Alternatively, processor 1212 may discard one bit for every two bits of the parity bits responsive to the first coding rate being 11/12.

In some implementations, in coding the input data at the first coding rate, processor 1212 may code the input data at a coding rate of 7/8 with an MCS index of 14 and using 4096-QAM.

In some implementations, in coding the input data at the first coding rate, processor 1212 may code the input data at a coding rate of 11/12 with an MCS index of 14 or 15 and using 4096-QAM.

In some implementations, in coding the input data at the first coding rate, processor 1212 may code the input data at a coding rate of 7/8 with an MCS index of 16 and using 4096-QAM based on the coding rate of 7/8 being indicated by existing MCS bits along with one reserved bit having a predefined value (e.g., "1" as shown in FIG. 8). Moreover, corresponding EHT-MCS bits may include 0000.

In some implementations, in coding the input data at the first coding rate, processor 1212 may code the input data at a coding rate of 11/12 with an MCS index of 17 and using 4096-QAM based on the coding rate of 11/12 being indicated by existing MCS bits along with one reserved bit having a predefined value (e.g., "1" as shown in FIG. 8). Moreover, corresponding EHT-MCS bits may include 0001.

In some implementations, processor 1212 may also signal, via transceiver 1216, to a station (e.g., apparatus 1220 as AP 120) in a WLAN to indicate support of the first coding rate with 4096-QAM by indicating a physical layer (PHY) capability in a capability field. For instance, as shown in FIG. 9, processor 1212 may indicate support of a 7/8 (or 11/12) coding rate by indicating "11" in the capability field.

Illustrative Processes

Figure 13:
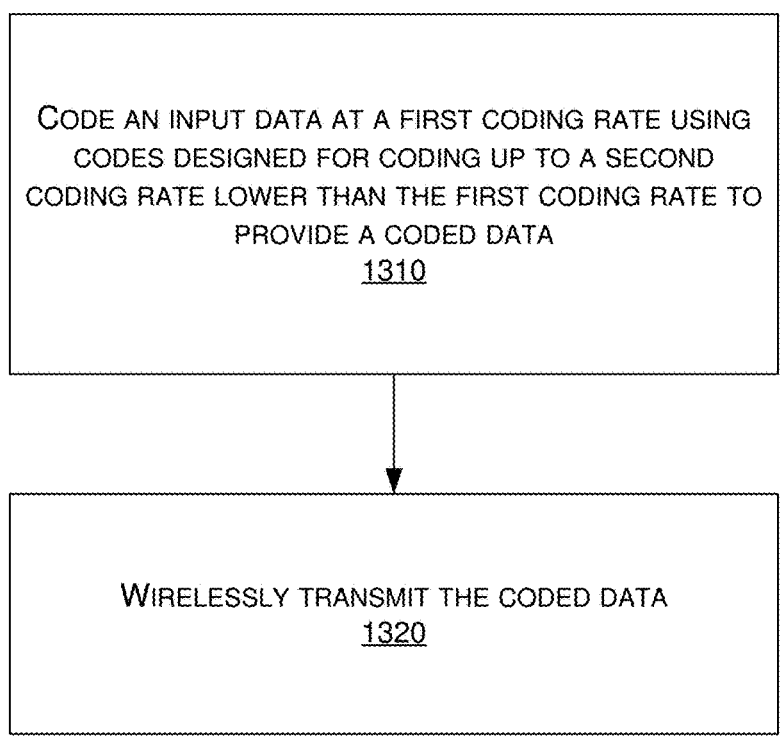
FIG. 13 is a flowchart of an example process in accordance with an implementation of the present disclosure.

FIG. 13 illustrates an example process 1300 in accordance with an implementation of the present disclosure. Process 1300 may represent an aspect of implementing various proposed designs, concepts, schemes, systems and methods described above. More specifically, process 1300 may represent an aspect of the proposed concepts and schemes pertaining to extremely high coding rates for next-generation WLAN systems in accordance with the present disclosure. Process 1300 may include one or more operations, actions, or functions as illustrated by one or more of blocks 1310 and 1320. Although illustrated as discrete blocks, various blocks of process 1300 may be divided into additional blocks, combined into fewer blocks, or eliminated, depending on the desired implementation. Moreover, the blocks/sub-blocks of process 1300 may be executed in the order shown in FIG. 13 or, alternatively in a different order. Furthermore, one or more of the blocks/sub-blocks of process 1300 may be executed repeatedly or iteratively. Process 1300 may be implemented by or in apparatus 1210 and apparatus 1220 as well as any variations thereof. Solely for illustrative purposes and without limiting the scope, process 1300 is described below in the context of apparatus 1210 implemented in or as STA 110 and apparatus 1220 implemented in or as AP 120 of a wireless network such as a WLAN in network environment 100 in accordance with one or more of IEEE 802.11 standards. Process 1300 may begin at block 1310.

At 1310, process 1300 may involve processor 1212 of apparatus 1210 coding an input data at a first coding rate using codes designed for coding up to a second coding rate lower than the first coding rate to provide a coded data. Process 1300 may proceed from 1310 to 1320.

At 1320, process 1300 may involve processor 1212 wirelessly transmitting, via transceiver 1216, the coded data (e.g., to apparatus 1220 as AP 120).

In some implementations, in coding the input data at the first coding rate using codes designed for coding up to the second coding rate, process 1300 may involve processor 1212 coding the input data at a rate higher than 5/6 using LDPC codes defined in one of IEEE 802.11n/ac/ax standards using 4096-QAM. Moreover, in wirelessly transmitting the coded data, process 1300 may involve processor 1212 wirelessly transmitting the coded data with transmit beamforming.

In some implementations, the second coding rate may be 5/6, and the first coding rate may be a rate higher than 5/6. For instance, the first coding rate may be 6/7, 7/8, 8/9, 9/10, 10/11, or 11/12.

In some implementations, in coding the input data, process 1300 may involve processor 1212 performing certain operations. For instance, process 1300 may involve processor 1212 performing a shortening procedure on the input data to provide a bit string comprising a plurality of data bits of the input data, one or more default shortened bits, and a plurality of shortening bits calculated from the shortening process. Additionally, process 1300 may involve processor 1212 generating a plurality of parity bits based on the bit string. Moreover, process 1300 may involve processor 1212 appending the parity bits to the bit string to provide a concatenated bit string. Furthermore, process 1300 may involve processor 1212 discarding the one or more default shortened bits and the plurality of shortened bits from the concatenated bit string to provide a shortened bit string. Then, process 1300 may involve processor 1212 either: (a) performing a puncturing procedure on the shortened bit string; or (b) performing a repeating procedure on the shortened bit string.

In some implementations, in performing the shortening procedure, process 1300 may involve processor 1212 calculating a number of total shortening bits ($N_{shrt}$) of the plurality of shortening bits as follows: $N_{shrt}=\max(0, (N_{CW} \times L_{LDPC} \times R) - N_{pld})$. Here, $N_{CW}$ may denote a number of LDPC codewords, $L_{LDPC}$ may denote a length of LDPC codeword, R may denote the first coding rate which is 7/8 or 11/12, and $N_{pld}$ may denote a number of bits in a PSDU and a SERVICE field.

In some implementations, a value of the number of default shortened bits ($N_{shrt\_default}$) may correspond to the first coding rate (R), a respective information block length (K0), a respective codeword block length (L), a respective length of the parity bits (P) such that: (a) for R=7/8, K0=539, L=616 and P=77, $N_{shrt\_default}$=1; (b) for R=7/8, K0=1078, L=1232 and P=154, $N_{shrt\_default}$=2; (c) for R=7/8, K0=1617, L=1848 and P=231, $N_{shrt\_default}$=3; (d) for R=11/12, K0=539, L=588 and P=49, $N_{shrt\_default}$=1; (e) for R=11/12, K0=1078, L=1176 and P=98, $N_{shrt\_default}$=2; and (f) for R=11/12, K0=1617, L=1764 and P=147, $N_{shrt\_default}$=3.

In some implementations, in performing the puncturing procedure, process 1300 may involve processor 1212 performing certain operations. For instance, process 1300 may involve processor 1212 calculating a number of total punctured bits. Moreover, process 1300 may involve processor 1212 either: (a) responsive to the number of total punctured bits determined to be greater than zero, puncturing a first number of bits of the parity bits; or (b) responsive to the number of total punctured bits determined to be equal to zero and a number of repeated bits per codeword being greater than a number of default punctured bits, puncturing a second number of bits of the parity bits. In such cases, the first number may equal the number of default punctured bits plus a number of punctured bits per codeword. Additionally, the second number may equal the number of default punctured bits minus the number of repeated bits per codeword.

In some implementations, a value of the number of default punctured bits ($N_{punc\_default}$) may correspond to the first coding rate (R), a respective information block length (K0), a respective codeword block length (L), a respective length of the parity bits (P) such that: (a) for R=7/8, K0=539, L=616 and P=77, $N_{punc\_default}$=31; (b) for R=7/8, K0=1078, L=1232 and P=154, $N_{punc\_default}$=62; (c) for R=7/8, K0=1617, L=1848 and P=231, $N_{punc\_default}$=93; (d) for R=11/12, K0=539, L=588 and P=49, $N_{punc\_default}$=59; (e) for R=11/12, K0=1078, L=1176 and P=98, $N_{punc\_default}$=118; and (f) for R=11/12, K0=1617, L=1764 and P=147, $N_{punc\_default}$=177.

In some implementations, in performing the puncturing procedure, process 1300 may involve processor 1212 performing additional operations. For instance, process 1300 may involve processor 1212 determining the number of punctured bits per codeword ($N_{ppcw}$) based on the number of total punctured bits. In such cases, in calculating the number of total punctured bits, process 1300 may involve processor 1212 calculating the number of total punctured bits ($N_{punc}$) as follows: $N_{punc}=\max(0, (N_{CW} \times L_{LDPC}) - N_{avbits} - N_{shrt})$. Here, $N_{CW}$ may denote a number of LDPC codewords, $L_{LDPC}$ may denote a length of LDPC codeword, $N_{avbits}$ may denote a number of available bits, and $N_{shrt}$ may denote a number of total shortening bits.

In some implementations, in performing the repeating procedure, process 1300 may involve processor 1212 performing certain operations. For instance, process 1300 may involve processor 1212 calculating a number of total repeated bits. Additionally, process 1300 may involve processor 1212 appending the total repeated bits to the parity bits responsive to a number of total punctured bits being equal to zero and a number of default punctured bits being less than a number of repeated bits per codeword.

In some implementations, in calculating the number of total repeated bits, process 1300 may involve processor 1212 calculating the number of total repeated bits ($N_{rep}$) as follows: $N_{rep}=\max(0, N_{avbits} - N_{CW} \times L_{LDPC} \times (1-R) - N_{pld})$. Here, $N_{avbits}$ may denote a number of available bits, $N_{CW}$ may denote a number of LDPC codewords, $L_{LDPC}$ may denote a length of LDPC codeword, R may denote the first coding rate which is 7/8 or 11/12, and $N_{pld}$ may denote a number of bits in a PSDU and a SERVICE field.

In some implementations, in performing the puncturing procedure, responsive to a number of total punctured bits ($N_{punc}$) being greater than or equal to zero, process 1300 may involve processor 1212 performing continuous puncturing on the shortened bit string by discarding last $N_{punc\_default}+N_{ppcw}$ bits of the parity bits. Here, $N_{punc\_default}$ may denote a number of default punctured bits, and $N_{ppcw}$ may denote a number of punctured bits per codeword.

In some implementations, in performing the puncturing procedure, responsive to a number of total punctured bits ($N_{punc}$) being greater than zero, process 1300 may involve processor 1212 performing interleaved puncturing on the shortened bit string by first discarding $N_{punc\_default}$ bits of the parity bits in an interleaved way and then discarding last $N_{ppcw}$ bits of remaining bits of the parity bits. Here, $N_{punc\_default}$ may denote a number of default punctured bits, and $N_{ppcw}$ may denote a number of punctured bits per codeword.

In some implementations, in discarding the $N_{punc\_default}$ bits of the parity bits in the interleaved way, process 1300 may involve processor 1212 discarding one bit for every three bits of the parity bits responsive to the first coding rate being 7/8. Alternatively, process 1300 may involve processor 1212 discarding one bit for every two bits of the parity bits responsive to the first coding rate being 11/12.

In some implementations, in coding the input data at the first coding rate, process 1300 may involve processor 1212 coding the input data at a coding rate of 7/8 with an MCS index of 14 and using 4096-QAM.

In some implementations, in coding the input data at the first coding rate, process 1300 may involve processor 1212 coding the input data at a coding rate of 11/12 with an MCS index of 14 or 15 and using 4096-QAM.

In some implementations, in coding the input data at the first coding rate, process 1300 may involve processor 1212 coding the input data at a coding rate of 7/8 with an MCS index of 16 and using 4096-QAM based on the coding rate of 7/8 being indicated by existing MCS bits along with one reserved bit having a predefined value (e.g., "1" as shown in FIG. 8). Moreover, corresponding EHT-MCS bits may include 0000.

In some implementations, in coding the input data at the first coding rate, process 1300 may involve processor 1212 coding the input data at a coding rate of 11/12 with an MCS index of 17 and using 4096-QAM based on the coding rate of 11/12 being indicated by existing MCS bits along with one reserved bit having a predefined value (e.g., "1" as shown in FIG. 8). Moreover, corresponding EHT-MCS bits may include 0001.

In some implementations, process 1300 may further involve processor 1212 signaling, via transceiver 1216, to a station (e.g., apparatus 1220 as AP 120) in a WLAN to indicate support of the first coding rate with 4096-QAM by indicating a PHY capability in a capability field. For instance, as shown in FIG. 9, process 1300 may involve processor 1212 indicating support of a 7/8 (or 11/12) coding rate with "11" in the capability field.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
coding, by a processor of an apparatus, an input data at a first coding rate using codes designed for coding up to a second coding rate lower than the first coding rate to provide a coded data; and
wirelessly transmitting, by the processor via a transceiver of the apparatus, the coded data.

2. The method of claim 1, wherein the coding of the input data at the first coding rate using codes designed for coding up to the second coding rate comprises coding the input data at a rate higher than 5/6 using low-density parity-check (LDPC) codes defined in one of Institute of Electrical and Electronics Engineers (IEEE) 802.11n/ac/ax standards using 4096-quadrature amplitude modulation (4096-QAM), and wherein the wirelessly transmitting of the coded data comprises wirelessly transmitting the coded data with transmit beamforming.

3. The method of claim 1, wherein the second coding rate is 5/6, and wherein the first coding rate comprises a rate higher than 5/6.

4. The method of claim 3, wherein the first coding rate is 6/7, 7/8, 8/9, 9/10, 10/11, or 11/12.

5. The method of claim 1, wherein the coding of the input data comprises:
performing a shortening procedure on the input data to provide a bit string comprising a plurality of data bits of the input data, one or more default shortened bits, and a plurality of shortening bits calculated from the shortening process;
generating a plurality of parity bits based on the bit string;
appending the parity bits to the bit string to provide a concatenated bit string;
discarding the one or more default shortened bits and the plurality of shortened bits from the concatenated bit string to provide a shortened bit string; and
either:
performing a puncturing procedure on the shortened bit string; or
performing a repeating procedure on the shortened bit string.

6. The method of claim 5, wherein the performing of the shortening procedure comprises calculating a number of total shortening bits ($N_{shrt}$) of the plurality of shortening bits as follows:
$N_{shrt}=\max(0, (N_{cw} \times L_{LDPC} \times R) - N_{pld})$,
wherein:
$N_{cw}$ denotes a number of LDPC codewords,
$L_{LDPC}$ denotes a length of LDPC codeword,
R denotes the first coding rate which is 7/8 or 11/12, and
$N_{pld}$ denotes a number of bits in a Physical Layer Convergence Protocol (PLCP) service data unit (PSDU) and SERVICE field.

7. The method of claim 6, wherein a value of the number of default shortened bits ($N_{shrt\_default}$) corresponds to the first coding rate (R), a respective information block length (K0), a respective codeword block length (L), a respective length of the parity bits (P) such that:
for R=7/8, K0=539, L=616 and P=77, $N_{shrt\_default}=1$;
for R=7/8, K0=1078, L=1232 and P=154, $N_{shrt\_default}=2$;
for R=7/8, K0=1617, L=1848 and P=231, $N_{shrt\_default}=3$;
for R=11/12, K0=539, L=588 and P=49, $N_{shrt\_default}=1$;
for R=11/12, K0=1078, L=1176 and P=98, $N_{shrt\_default}=2$; and
for R=11/12, K0=1617, L=1764 and P=147, $N_{shrt\_default}=3$.

8. The method of claim 5, wherein the performing of the puncturing procedure comprises:
calculating a number of total punctured bits; and
either:
responsive to the number of total punctured bits determined to be greater than zero, puncturing a first number of bits of the parity bits; or
responsive to the number of total punctured bits determined to be equal to zero and a number of repeated bits per codeword being greater than a number of default punctured bits, puncturing a second number of bits of the parity bits,
wherein the first number equals the number of default punctured bits plus a number of punctured bits per codeword, and
wherein the second number equals the number of default punctured bits minus the number of repeated bits per codeword.

9. The method of claim 8, wherein a value of the number of default punctured bits ($N_{punc\_default}$) corresponds to the first coding rate (R), a respective information block length (K0), a respective codeword block length (L), a respective length of the parity bits (P) such that:
for R=7/8, K0=539, L=616 and P=77, $N_{punc\_default}=31$;
for R=7/8, K0=1078, L=1232 and P=154, $N_{punc\_default}=62$;
for R=7/8, K0=1617, L=1848 and P=231, $N_{punc\_default}=93$;
for R=11/12, K0=539, L=588 and P=49, $N_{punc\_default}=59$;
for R=11/12, K0=1078, L=1176 and P=98, $N_{punc\_default}=118$; and
for R=11/12, K0=1617, L=1764 and P=147, $N_{punc\_default}=177$.

10. The method of claim 8, wherein the performing of the puncturing procedure further comprises:
determining the number of punctured bits per codeword ($N_{ppcw}$) based on the number of total punctured bits,
wherein the calculating of the number of total punctured bits comprises calculating the number of total punctured bits ($N_{punc}$) as follows:
$N_{punc}=\max(0, (N_{cw} \times L_{LDPC}) - N_{avbits} - N_{shrt})$,
wherein:
$N_{cw}$ denotes a number of LDPC codewords,
$L_{LDPC}$ denotes a length of LDPC codeword,
$N_{avbits}$ denotes a number of available bits, and
$N_{shrt}$ denotes a number of total shortening bits.

11. The method of claim 5, wherein the performing of the repeating procedure comprises:
calculating a number of total repeated bits; and
appending the total repeated bits to the parity bits responsive to a number of total punctured bits being equal to zero and a number of default punctured bits being less than a number of repeated bits per codeword.

12. The method of claim 11, wherein the calculating of the number of total repeated bits comprises calculating the number of total repeated bits ($N_{rep}$) as follows:
$N_{rep}=\max(0, N_{avbits} - N_{cw} \times L_{LDPC} \times (1-R) - N_{pld})$,
wherein:
$N_{avbits}$ denotes a number of available bits,
$N_{cw}$ denotes a number of LDPC codewords, $L_{LDPC}$ denotes a length of LDPC codeword, R denotes the first coding rate which is 7/8 or 11/12, and $N_{pld}$ denotes a number of bits in a Physical Layer Convergence Protocol (PLCP) service data unit (PSDU) and SERVICE field.

13. The method of claim 5, wherein the performing of the puncturing procedure comprises, responsive to a number of total punctured bits ($N_{punc}$) being greater than or equal to zero, performing continuous puncturing on the shortened bit string by discarding last $N_{punc\_default}+N_{ppcw}$ bits of the parity bits, and wherein:

$N_{punc\_default}$ denotes a number of default punctured bits, and $N_{ppcw}$ denotes a number of punctured bits per codeword.

14. The method of claim 5, wherein the performing of the puncturing procedure comprises, responsive to a number of total punctured bits ($N_{punc}$) being greater than zero, performing interleaved puncturing on the shortened bit string by first discarding $N_{punc\_default}$ bits of the parity bits in an interleaved way and then discarding last $N_{ppcw}$ bits of remaining bits of the parity bits, and wherein:

$N_{punc\_default}$ denotes a number of default punctured bits, and $N_{ppcw}$ denotes a number of punctured bits per codeword.

15. The method of claim 14, wherein the discarding of the $N_{punc\_default}$ bits of the parity bits in the interleaved way comprises:

responsive to the first coding rate being 7/8, discarding one bit for every three bits of the parity bits; or responsive to the first coding rate being 11/12, discarding one bit for every two bits of the parity bits.

16. The method of claim 1, wherein the coding of the input data at the first coding rate comprises coding the input data at a coding rate of 7/8 with a modulation and coding scheme (MCS) index of 14 and using 4096-quadrature amplitude modulation (4096-QAM).

17. The method of claim 1, wherein the coding of the input data at the first coding rate comprises coding the input data at a coding rate of 11/12 with a modulation and coding scheme (MCS) index of 14 or 15 and using 4096-quadrature amplitude modulation (4096-QAM).

18. The method of claim 1, wherein the coding of the input data at the first coding rate comprises coding the input data at a coding rate of 7/8 with a modulation and coding scheme (MCS) index of 16 and using 4096-quadrature amplitude modulation (4096-QAM) based on the coding rate of 7/8 being indicated by existing MCS bits along with one reserved bit having a predefined value, and wherein corresponding extreme high-throughput (EHT)-MCS bits comprise 0000.

19. The method of claim 1, wherein the coding of the input data at the first coding rate comprises coding the input data at a coding rate of 11/12 with a modulation and coding scheme (MCS) index of 17 and using 4096-quadrature amplitude modulation (4096-QAM) based on the coding rate of 11/12 being indicated by existing MCS bits along with one reserved bit having a predefined value, and wherein corresponding extreme high-throughput (EHT)-MCS bits comprise 0001.

20. The method of claim 1, further comprising:

signaling to a station in a wireless local area network (WLAN) to indicate support of the first coding rate with 4096-quadrature amplitude modulation (4096-QAM) by indicating a physical layer (PHY) capability in a capability field.

* * * * *